United States Patent [19]
Felker et al.

[11] Patent Number: 5,600,146
[45] Date of Patent: Feb. 4, 1997

[54] CHARGED PARTICLE BEAM MULTIPLE-POLE DEFLECTION CONTROL CIRCUITRY

[75] Inventors: Joseph A. Felker, Belle Mead; Thomas C. Russell, Murray Hill, both of N.J.

[73] Assignee: Lucent Technologies Inc., Murray Hill, N.J.

[21] Appl. No.: 561,906

[22] Filed: Nov. 22, 1995

[51] Int. Cl.[6] .................................................. H01J 37/147
[52] U.S. Cl. ......................................................... 250/396 R
[58] Field of Search ....................... 250/396 R; 315/391, 315/367, 364, 410; 313/432, 439

[56] References Cited

U.S. PATENT DOCUMENTS

| | | | |
|---|---|---|---|
| 4,053,740 | 10/1977 | Rosenthal | 364/705 |
| 4,639,602 | 1/1987 | Henzler | 250/396 R |
| 5,245,194 | 9/1993 | Oae et al. | 250/396 R |

*Primary Examiner*—Jack I. Berman
*Attorney, Agent, or Firm*—David I. Caplan

[57] ABSTRACT

Circuitry that controls a multiple-plate charged particle beam deflection arrangement includes a Digital Signal Processor (DSP) acting through a separate accumulating Arithmetic Logic Unit (ALU) connected to each of the plates. For each line to be scanned, at the commencement of the scanning of the line, the DSP delivers to each accumulating ALU a separate signal composed of a digital number representing an initial value (if any) and a digital number representing a step size. During each subsequent cycle of a clock, each accumulating ALU successively adds the step size to a resulting cumulative sum. This cumulative sum depends upon the initial value (if any) plus the step size multiplied by the number of cycles that have elapsed since the initial cycle.

9 Claims, 1 Drawing Sheet

CHARGED PARTICLE BEAM MULTIPLE-POLE DEFLECTION CONTROL CIRCUITRY

GOVERNMENT CONTRACT

This invention was made with Government support under Contract MDA972-94-C-0013. The Government has certain rights in this invention.

TECHNICAL FIELD OF INVENTION

This invention relates to charged particle beam deflection control circuitry and to methods of scanning charged particle beams. More particularly the invention relates to such circuitry that controls charged particle beam deflections by arrangements of multiple beam deflection plates ("multiple poles"). As used herein, the term "multiple-pole" refers to at least four deflection plates arranged in a polar (angular-type) array. Typically the array is a circularly-cylindrical-type array.

BACKGROUND OF INVENTION

In order to deflect an electron beam—or other charged particle beam (e.g., ion beam)—in a raster scanning manner, ordinarily at least four plates are required. Charged-particle-beam control circuitry applies a controllable voltage separately to each of the plates. However, in many practical applications, advantageously eight (or more) plates in an "octapole arrangement" are used, because the octapole (or higher) arrangement provides more uniform deflection fields (lower fringing fields). In this way, the deflections of the charged particle beam are more accurately controlled—i.e., do not suffer from the distortions otherwise caused by the relatively large fringing fields produced by smaller numbers of plates. If desired, more than eight plates can be used, such as sixteen or as many thirty-two plates in a multiple-pole arrangement, in order to reduce the fringing fields still further.

When using an octapole (or higher pole) arrangement, in prior art the voltage applied to each of the plates is supplied by a general purpose digital computer acting through several separate multiplying digital-to-analog converters ("DACs") and operational amplifiers ("Op-Amps") for each plate. The circuitry of each DAC and Op-Amp is analog, and therefore the circuitry suffers from ordinary noise and instability problems. As the number of plates increase, the noise generated in the circuitry becomes a critical problem because of the increased complexity of the required analog circuitry, and hence the noise increases with the number of plates. Moreover, as the number of plates increase, stability of voltages delivered to the plates also becomes a critical problem, because the stability deteriorates as the complexity of the analog circuitry increases.

Relevant to this subject is U.S. Pat. No. 4,053,740, entitled "Video Game System," issued to Lawrence David Rosenthal on Oct. 11, 1977. That patent, however deals only with deflection of the charged particle beam by means in the x direction controlled by an RC voltage decay applied to a first pair of plates and in the y direction by a second pair of plates. The voltage applied to the second pair of plates is generated, among other circuitry, by means of an accumulating Arithmetic Logic Unit ("ALU"). However, the circuitry taught by this patent is quite limited insofar as the kinds of deflections that it produces.

It would be desirable to have multiple-pole charged particle beam deflection control circuitry that alleviates one or more problems of prior art.

SUMMARY OF INVENTION

According to the invention, a digital signal processor ("DSP") is connected, via a separate accumulating ALU in series with a separate digital-to-analog converter, to each of the plates of a multiple-pole charged particle beam deflection arrangement. Thus the number of DSPs is equal to one, but the number (N) of accumulating ALUs (hereinafter simply "ALUs") is equal to the number (N) of plates.

During electrical operations, clock timing circuitry controls the timing of the DSP ("DSP clock"). Each DSP clock cycle corresponds to a single scan line of raster scanning. At the beginning of each scan line (at the beginning of each DSP clock cycle), the DSP clock enables the DSP to deliver a separate signal to each of the ALUs, one after the other, whereby the output of each of the ALUs is initialized. This signal has two components for each of the ALUs: (1) an initial value (initial position of the charged particle beam for the scan line), and (2) an incrementing value (step size)—both of which can be different for each of the ALUs. During subsequent scanning of a single scan line, each of the ALUs increases its output by its incrementing value once during each cycle of ALU clock time circuitry ("ALU clock cycle"). At the end of each ALU clock cycle, the thus updated output of each of the ALUs is delivered to a separate digital-to-analog converter ("DAC"), whereby the output of each of the DACs is updated. The thus updated output of each of the DACs is then delivered to a separate one of the plates. In this way, the problems of noise and stability of the analog circuitry are mitigated because (1) the ALUs perform much of the tasks that the analog circuitry of prior art was required to perform, whereby the analog circuitry of the present invention has simpler circuitry and hence suffers from less noise than the circuitry of prior art, and (2) the ALUs, being digital circuitry, do not introduce noise or instability.

Advantageously, each of the ALUs has a unique address, and the DSP contains circuitry that enables the DSP to send each of its output signals to the appropriate address of the ALU—that is, to the address of that one of the ALUs (the "instantaneously assigned ALU") to which the DSP is supposed to be delivering signal at any instant of time.

The need for the DACs arises from the fact that the output of each of the ALUs, being digital, ordinarily is not suited for direct delivery to a charged particle beam deflection plate.

Advantageously also, a current-to-voltage converter intervenes between each of the DACs and each of the plates in case the output of the DAC is an electrical current, because the required input to a charged particle beam deflection plate ordinarily is a voltage. The current-to-voltage converter (if any) can take the form of a multistage operational amplifier having a closed (feedback) loop configuration in at least an initial stage thereof.

The invention thus also provides a method of scanning a charged particle beam using a multiplicity of deflection plates. More specifically, the method involves scanning a charged particle beam, using a multiplicity of deflection plates, comprising the steps of:

(a) delivering to each of a multiplicity of accumulating arithmetic units a separate signal generated by a digital signal processor, whereby the accumulating arithmetic logic units develop output signals; and (b) delivering, to the charged particle beam deflection plates, analog representatives of the output signals developed by the accumulating arithmetic logic units.

DETAILED DESCRIPTION

Figure 1:
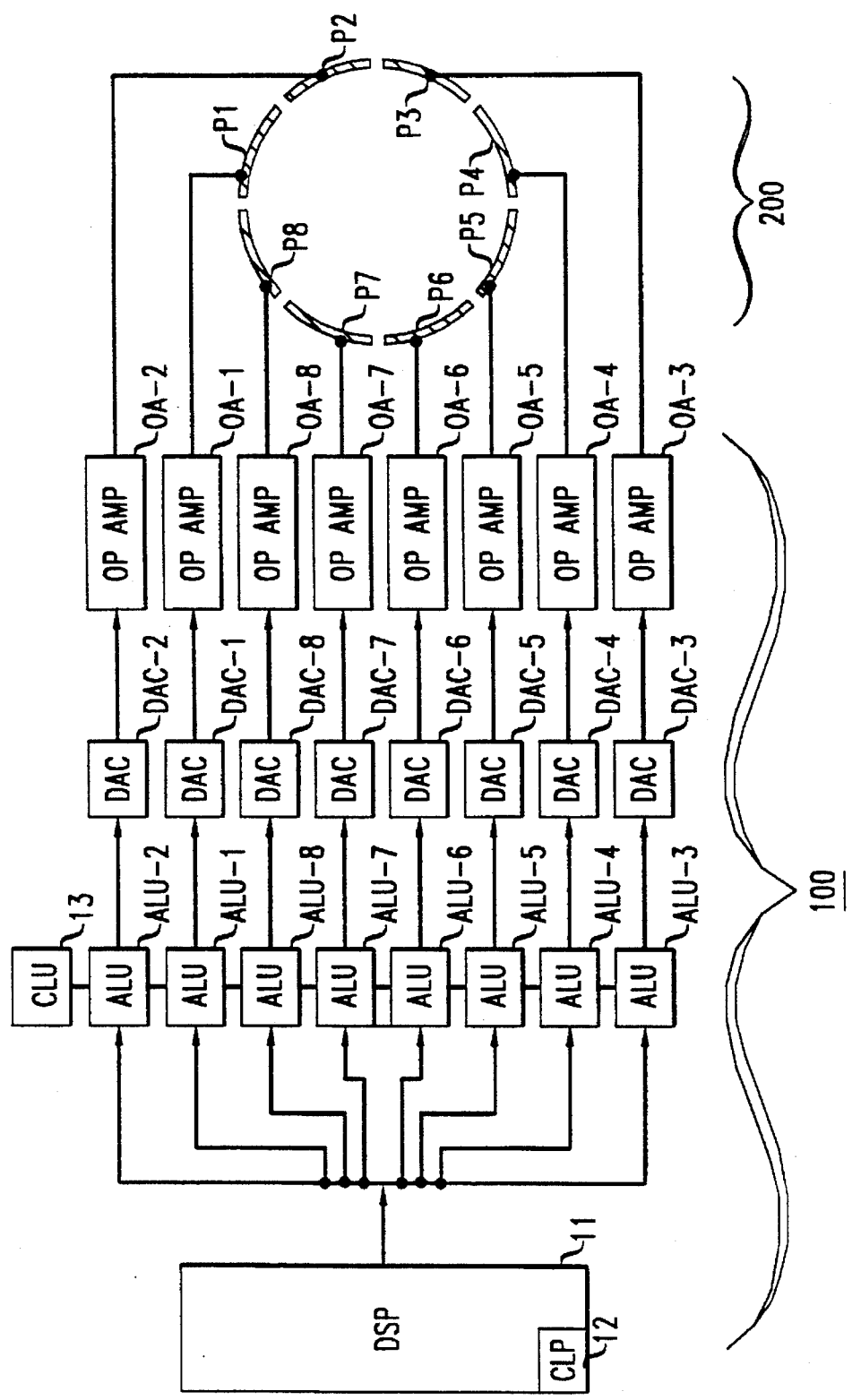
FIG. 1 is a block diagram of exemplary charged particle beam multiple-pole deflection control circuitry, together with a cross-section diagram of an octapole deflection plate arrangement, in accordance with a specific embodiment of the invention,.

As shown in FIG. 1, charged particle beam multiple-pole deflection control circuitry 100 is arranged to control the voltages being delivered to eight separate plates P1, P2, P3, . . . , P8 of an octapole deflection plate arrangement 200. These plates P1, P2, P3, . . . , P8 typically are arranged in a circularly cylindrical configuration as shown.

An additional set of eight similarly arranged plates (not shown) typically are present behind, and in registry with, the plates P1, P2, P3, . . . , P8. The purpose of this additional set of plates is to afford shift and tilt deflections of a charged particle beam (not shown) originally directed along the axis of the cylinder formed by the plates P1, P2, P3, . . . , P8—as known in the art of charged particle beam deflection.

As further shown in FIG. 1, a DSP 11 has clock timing circuitry 12 ("CLP") arranged to control the timing of the DSP 11 as known in the art and as described in greater detail below. This DSP 11 has an output port that is connected to an input port of every one of arithmetic logic units ALU-1, ALU-2, ALU-3, . . . , ALU-8. Each of these arithmetic logic units ALU-1, ALU-2, ALU-3, . . . , ALU-8 is connected to ALU scanning-clock-timing circuitry 13 ("CLU") that controls its timing. In addition, each of these arithmetic logic units ALU-1, ALU-2, ALU-3, . . . , ALU-8 has an output port connect to an input port of a separate one of digital-to-analog converters DAC-1, DAC-2, DAC-3, . . . , DAC-8. Each of these digital-to-analog converters DAC-1, DAC-2, DAC-3, . . . , DAC-8 has an output port connected to an input port of a separate one of operational amplifiers OA-1, OA-2, OA-3, , OA-8. Each of these operational amplifiers OA-1, OA-2, OA-3, , OA-8 has an output port connected to a separate one of the plates P1, P2, P3, . . . , P8.

Advantageously, each of the operational amplifiers OA-1, OA-2, OA-3, , OA-8 has an initial stage having a closed loop (feedback) configuration. In this way the initial stage converts electrical current input into voltage output.

During operations, under control of DSP clock circuitry CLP, at the commencement of each desired scanning of one line of the charged particle beam, during an initial CLP cycle, the DSP 11 delivers an initial signal to each of ALU-1, ALU-2, ALU-3, . . . , ALU-8. This initial signal has two components: an initial value and an incrementing value. For the line being scanned, the initial value corresponds to an initial position of the charged particle beam, while the incrementing value corresponds to a desired step-size of the charged particle beam. During each subsequent cycle of the ALU scanning clock timing circuitry CLU, each of ALU-1, ALU-2, ALU-3, . . . , ALU-8, respectively, increments its output by the incrementing value that it had received from the DSP 11 during the initial CLP cycle (at the commencement of the desired scanning of the line). Thus, during each such subsequent cycle of the timing circuitry CLU, each of ALU-1, ALU-2, ALU-3, . . . , ALU-8 respectively updates its output by its respective incrementing value. In this way, during each CLU cycle the resulting data stored in each of ALU-1, ALU-2, ALU-3, . . . , ALU-8 is updated to a cumulative sum that depends upon the DSP processor signals, both initial value and incrementing value, delivered to it during the initial CLP cycle, as well as of the total number of CLU cycles that have elapsed between the present CLU cycle and the initial CLP cycle.

Advantageously, each of these ALUs has a unique address, and the DSP contains circuitry that enables the DSP to send each of its output signals to the appropriate address—that is, to the address of that one of the ALUs (the "instantaneously assigned ALU") to which the DSP is supposed to be delivering signal during the initial DSP cycle.

During each successive CLU cycle for the line being scanned, each of the arithmetic logic units ALU-1, ALU-2, ALU-3, . . . , ALU-8 delivers the updated ALU output signal separately to DAC-1, DAC-2, DAC-3, . . . , DAC-8, respectively. Each such updated ALU output signal is equal to the previous ALU output signal plus the respective incrementing value for that ALU and for the line being scanned. Each such updated ALU output signal of each ALU-1, ALU-2, ALU-3, . . . , ALU-8, respectively, is thus delivered to a separate one of DAC-1, DAC-2, DAC-3, . . . , DAC-8, respectively. In response, each of DAC-1, DAC-2, DAC-3, . . . , DAC-8, respectively, thus delivers an updated DAC output signal separately to the operational amplifiers OA-1, OA-2, OA-3, , OA-8, respectively. Finally, each of OA-1, OA-2, OA-3, , OA-8 separately delivers an updated OA output signal separately to the plates P1, P2, P3, . . . , P8.

Although the invention has been described in detail with reference to a specific embodiment, various modifications can be made without departing from the scope of the invention. For example, instead of eight plates P1, P2, P3, . . . , P8, there can be sixteen plates in combination with sixteen branches mutually connected in parallel, each branch comprising an ALU connected in series with a DAC connected in series with an Op-Amp. That is to say, instead of N=8, N can be equal to sixteen. Alternatively, the number N can be equal to even more than sixteen. Finally, the DSP can deliver its signals to the ALUs in a parallel port configuration—i.e., can deliver these signals along N separate wires, one wire to each of the ALUs—rather than a serial port configuration described above.

What is claimed is:

1. Charged particle beam multiple-pole deflection control circuitry comprising (a) a digital signal processor having at least an output port to which the digital signal processor can deliver processor signals;

(b) a multiplicity of accumulating arithmetic logic units, each of the accumulating arithmetic logic units having a separate output port and having a separate input port connected to the output port of the digital signal processor, whereby the input port of each of the accumulating arithmetic logic units can receive the processor signals; and (c) a multiplicity of plates, located in an array suitable for deflecting the charged particle beam, each of the plates connected to receive a voltage corresponding to a scan output developed at the output port of a separate one of the accumulating arithmetic logic units.

2. The circuitry of claim 1 further comprising clock timing circuitry that generates scanning clock cycle signals that control updating of the scan output signals, whereby during each of resulting scanning clock cycles each of the accumulating arithmetic logic units updates its scan output developed at its output port.

3. The circuitry of claim 2 further comprising a separate digital-to-analog converter connected intervening between each of the plates and each of the output ports of each of the accumulating arithmetic logic units.

4. The circuitry of claim 2 in which each of the processor signals comprises an initial value and an incrementing value, the incrementing value being added to the scan output of the accumulating arithmetic unit during each scanning clock cycle.

5. The circuitry of claim 4 further comprising a separate digital-to-analog converter connected intervening between each of the plates and each of the output ports of each of the accumulating arithmetic logic units.

6. The circuitry of claim 5 further comprising a separate current-to-voltage converter connected intervening between each of the plates and each of the digital-to-analog converters.

7. The circuitry of claim 1 further comprising a separate digital-to-analog converter connected intervening between each of the plates and each of the output ports of each of the accumulating arithmetic logic units.

8. The circuitry of claim 7 further comprising a separate current-to-voltage converter connected intervening between each of the plates and each of the digital-to-analog converters.

9. A method of scanning a charged particle beam, using a multiplicity of deflection plates, comprising the steps of:

(a) delivering to each of a multiplicity of accumulating arithmetic units a separate signal generated by a digital signal processor, whereby the accumulating arithmetic logic units develop output signals; and (b) delivering, to the charged particle beam deflection plates, analog representatives of the output signals developed by the accumulating arithmetic logic units.

* * * * *